US010892406B2

(12) United States Patent
Russell et al.

(10) Patent No.: US 10,892,406 B2
(45) Date of Patent: Jan. 12, 2021

(54) PHASE CHANGE MEMORY STRUCTURES AND DEVICES

(71) Applicant: Intel Corporation, Santa Clara, CA (US)

(72) Inventors: Stephen Russell, Boise, ID (US); Andrea Gotti, Vaprio d'Adda (IT); Andrea Redaelli, Casatenovo (IT); Enrico Varesi, Milan (IT); Innocenzo Tortorelli, Cernusco sul Naviglio (IT); Lorenzo Fratin, Vimercate (IT); Alessandro Sebastiani, Vimercate (IT)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/997,628

(22) Filed: Jun. 4, 2018

(65) Prior Publication Data
US 2019/0044060 A1 Feb. 7, 2019

(51) Int. Cl.
*H01L 45/00* (2006.01)
*G11C 13/00* (2006.01)

(52) U.S. Cl.
CPC .......... *H01L 45/06* (2013.01); *G11C 13/0026* (2013.01); *H01L 45/1253* (2013.01); *H01L 45/144* (2013.01); *H01L 45/145* (2013.01); *H01L 45/149* (2013.01); *H01L 45/1625* (2013.01); *G11C 13/0004* (2013.01); *G11C 2213/52* (2013.01); *H01L 45/1608* (2013.01)

(58) Field of Classification Search
CPC . H01L 45/06; H01L 45/1233; H01L 45/1253; H01L 27/2409; H01L 27/2418; H01L 27/2427
See application file for complete search history.

(56) References Cited

U.S. PATENT DOCUMENTS

| 4,823,182 A | 4/1989 | Okumura |
| 5,536,947 A | 7/1996 | Klersy et al. |
| 6,081,034 A | 6/2000 | Sandhu et al. |
| 6,136,682 A | 10/2000 | Hegde et al. |
| 7,892,936 B1 | 2/2011 | Wu et al. |
| 7,923,839 B2 | 4/2011 | Kitamura et al. |
| 8,030,734 B2 | 10/2011 | Dennison et al. |

(Continued)

FOREIGN PATENT DOCUMENTS

| KR | 10-2008-0009397 A | 1/2008 |
| KR | 10-2008-0069761 A | 7/2008 |

(Continued)

OTHER PUBLICATIONS

Simka et al.; "Fundamentals of Cu/Barrier-Layer Adhesion in Microelectronic Processing"; Materials Research Society Symposium Proceedings; (2005); pp. B9.2.1-B9.2.6; vol. 863.

*Primary Examiner* — Allison Bernstein
(74) *Attorney, Agent, or Firm* — Alliance IP, LLC (57) ABSTRACT

A phase change memory (PCM) cell can include a PCM layer. A first electrode and a second electrode disposed on opposite sides of the PCM layer. The first electrode, the second electrode, or both includes a metal ceramic composite material layer disposed between an upper barrier layer and a lower barrier layer and wherein the metal ceramic composite material layer provides a corresponding electrode with an electrical resistivity of from 10 mOhm-cm to 1000 mOhm-cm.

23 Claims, 8 Drawing Sheets

(56) References Cited

U.S. PATENT DOCUMENTS

| | | | |
|---|---|---|---|
| 8,084,842 B2 * | 12/2011 | Chen | G11C 11/5678 257/246 |
| 8,183,602 B2 * | 5/2012 | Tabata | G11C 13/00 257/211 |
| 9,299,747 B1 | 3/2016 | Pellizzer et al. | |
| 9,419,212 B2 * | 8/2016 | Petz | H01L 45/141 |
| 9,608,042 B2 | 3/2017 | Pellizzer et al. | |
| 2006/0148248 A1 | 7/2006 | Brooks et al. | |
| 2006/0278900 A1 * | 12/2006 | Chang | H01L 45/04 257/248 |
| 2007/0075427 A1 | 4/2007 | Lavoie et al. | |
| 2007/0249090 A1 | 10/2007 | Philipp et al. | |
| 2008/0237566 A1 | 10/2008 | An et al. | |
| 2009/0242866 A1 | 10/2009 | Ko et al. | |
| 2010/0176365 A1 | 7/2010 | Park et al. | |
| 2010/0210068 A1 | 8/2010 | Lee et al. | |
| 2011/0057162 A1 | 3/2011 | Breitwisch et al. | |
| 2011/0095258 A1 | 4/2011 | Xu et al. | |
| 2011/0278531 A1 | 11/2011 | Erbetta et al. | |
| 2011/0312178 A1 | 12/2011 | Watanabe et al. | |
| 2012/0040528 A1 | 2/2012 | Kim et al. | |
| 2012/0225534 A1 | 9/2012 | Lee et al. | |
| 2013/0126510 A1 | 5/2013 | Oh et al. | |
| 2013/0277640 A1 | 10/2013 | Nishimura et al. | |
| 2014/0048859 A1 | 2/2014 | Nakano | |
| 2015/0069630 A1 | 3/2015 | Sciarrillo | |
| 2016/0093804 A1 | 3/2016 | Petz et al. | |

FOREIGN PATENT DOCUMENTS

| | | |
|---|---|---|
| KR | 10-2009-0090002 A | 8/2009 |
| KR | 10-2010-0032580 A | 3/2010 |
| KR | 10-2010-00090969 A | 8/2010 |
| TW | 201332173 A | 8/2013 |
| WO | WO 97/15954 A1 | 5/1997 |
| WO | WO 2009/126891 A1 | 10/2009 |

* cited by examiner

FIG. 5D

PHASE CHANGE MEMORY STRUCTURES AND DEVICES

BACKGROUND

Phase change materials have properties that invite their use in a number of applications such as ovonic threshold switches and phase change memory (PCM). Different physical states of the phase change material have different levels of electrical resistance. For example, one state, such as an amorphous state, can have a high electrical resistance, while another state, such as a crystalline state, can have a low electrical resistance. In PCM, these different levels of electrical resistance can be used to store binary information. Each state is designated a different binary value, and once stored, information can be read by detecting the electrical resistance of the material. The fact that each state persists once fixed makes PCM a valuable non-volatile memory (NVM) type.

DESCRIPTION OF EMBODIMENTS

Although the following detailed description contains many specifics for the purpose of illustration, a person of ordinary skill in the art will appreciate that many variations and alterations to the following details can be made and are considered to be included herein. Accordingly, the following embodiments are set forth without any loss of generality to, and without imposing limitations upon, any claims set forth. It is also to be understood that the terminology used herein is for the purpose of describing particular embodiments only, and is not intended to be limiting. Unless defined otherwise, all technical and scientific terms used herein have the same meaning as commonly understood by one of ordinary skill in the art to which this disclosure belongs.

As used in this written description, the singular forms "a," "an" and "the" include express support for plural referents unless the context clearly dictates otherwise. Thus, for example, reference to "a sensor" includes a plurality of such sensors.

In this application, "comprises," "comprising," "containing" and "having" and the like can have the meaning ascribed to them in U.S. Patent law and can mean "includes," "including," and the like, and are generally interpreted to be open ended terms. The terms "consisting of" or "consists of" are closed terms, and include only the components, structures, steps, or the like specifically listed in conjunction with such terms, as well as that which is in accordance with U.S. Patent law. "Consisting essentially of" or "consists essentially of" have the meaning generally ascribed to them by U.S. Patent law. In particular, such terms are generally closed terms, with the exception of allowing inclusion of additional items, materials, components, steps, or elements, that do not materially affect the basic and novel characteristics or function of the item(s) used in connection therewith. For example, trace elements present in a composition, but not affecting the compositions nature or characteristics would be permissible if present under the "consisting essentially of" language, even though not expressly recited in a list of items following such terminology. When using an open ended term, like "comprising" or "including," in this written description it is understood that direct support should be afforded also to "consisting essentially of" language as well as "consisting of" language as if stated explicitly and vice versa.

The terms "first," "second," "third," "fourth," and the like in the description and in the claims, if any, are used for distinguishing between similar elements and not necessarily for describing a particular sequential or chronological order. It is to be understood that any terms so used are interchangeable under appropriate circumstances such that the embodiments described herein are, for example, capable of operation in sequences other than those illustrated or otherwise described herein. Similarly, if a method is described herein as comprising a series of steps, the order of such steps as presented herein is not necessarily the only order in which such steps may be performed, and certain of the stated steps may possibly be omitted and/or certain other steps not described herein may possibly be added to the method.

The terms "left," "right," "front," "back," "top," "bottom," "over," "under," and the like in the description and in the claims, if any, are used for descriptive purposes and not necessarily for describing permanent relative positions. It is to be understood that the terms so used are interchangeable under appropriate circumstances such that the embodiments described herein are, for example, capable of operation in other orientations than those illustrated or otherwise described herein. The term "coupled," as used herein, is defined as directly or indirectly connected in an electrical or nonelectrical manner. Objects described herein as being "adjacent to" each other may be in physical contact with each other, in close proximity to each other, or in the same general region or area as each other, as appropriate for the context in which the phrase is used. Occurrences of the phrase "in one embodiment," or "in one aspect," herein do not necessarily all refer to the same embodiment or aspect.

The term "coupled," as used herein, is defined as directly or indirectly connected in an electrical or nonelectrical manner. "Directly coupled" structures or elements are in physical contact with one another and are attached. Objects described herein as being "adjacent to" each other may be in physical contact with each other, in close proximity to each other, or in the same general region or area as each other, as appropriate for the context in which the phrase is used.

As used herein, the term "substantially" refers to the complete or nearly complete extent or degree of an action, characteristic, property, state, structure, item, or result. For example, an object that is "substantially" enclosed would mean that the object is either completely enclosed or nearly completely enclosed. The exact allowable degree of deviation from absolute completeness may in some cases depend on the specific context. However, generally speaking the nearness of completion will be so as to have the same overall result as if absolute and total completion were obtained. The use of "substantially" is equally applicable when used in a negative connotation to refer to the complete or near complete lack of an action, characteristic, property, state, structure, item, or result. For example, a composition that is "substantially free of" particles would either completely lack particles, or so nearly completely lack particles that the effect would be the same as if it completely lacked particles. In other words, a composition that is "substantially free of" an ingredient or element may still actually contain such item as long as there is no measurable effect thereof.

As used herein, the term "about" is used to provide flexibility to a numerical range endpoint by providing that a given value may be "a little above" or "a little below" the endpoint. Unless otherwise stated, use of the term "about" in accordance with a specific number or numerical range should also be understood to provide support for such numerical terms or range without the term "about". For example, for the sake of convenience and brevity, a numerical range of "about 50 angstroms to about 80 angstroms" should also be understood to provide support for the range of "50 angstroms to 80 angstroms." Furthermore, it is to be understood that in this specification support for actual numerical values is provided even when the term "about" is used therewith. For example, the recitation of "about" 30 should be construed as not only providing support for values a little above and a little below 30, but also for the actual numerical value of 30 as well.

As used herein, a plurality of items, structural elements, compositional elements, and/or materials may be presented in a common list for convenience. However, these lists should be construed as though each member of the list is individually identified as a separate and unique member. Thus, no individual member of such list should be construed as a de facto equivalent of any other member of the same list solely based on their presentation in a common group without indications to the contrary.

Concentrations, amounts, and other numerical data may be expressed or presented herein in a range format. It is to be understood that such a range format is used merely for convenience and brevity and thus should be interpreted flexibly to include not only the numerical values explicitly recited as the limits of the range, but also to include all the individual numerical values or sub-ranges encompassed within that range as if each numerical value and sub-range is explicitly recited. As an illustration, a numerical range of "about 1 to about 5" should be interpreted to include not only the explicitly recited values of about 1 to about 5, but also include individual values and sub-ranges within the indicated range. Thus, included in this numerical range are individual values such as 2, 3, and 4 and sub-ranges such as from 1-3, from 2-4, and from 3-5, etc., as well as 1, 2, 3, 4, and 5, individually.

This same principle applies to ranges reciting only one numerical value as a minimum or a maximum. Furthermore, such an interpretation should apply regardless of the breadth of the range or the characteristics being described.

Reference throughout this specification to "an example" means that a particular feature, structure, or characteristic described in connection with the example is included in at least one embodiment. Thus, appearances of the phrases "in an example" in various places throughout this specification are not necessarily all referring to the same embodiment.

Example Embodiments

An initial overview of technology embodiments is provided below and specific embodiments are then described in further detail. This initial summary is intended to aid readers in understanding the technological concepts more quickly, but is not intended to identify key or essential features thereof, nor is it intended to limit the scope of the claimed subject matter.

Phase change memory devices have been developed to include an array of memory cells connected to bitlines and wordlines, for example, byte-addressable, write-in-place non-volatile memory (NVM) such as three-dimensional (3D) cross-point memory. In many cases, each phase change memory cell is made up of a number of layers of different materials. Such layers can include a phase change material, electrodes, select device materials, diffusion barrier materials, thermal insulating materials, and so on. In some cases, individual memory cells can be separated by dielectric materials to electrically insulate the memory cells one from another. Bitlines and wordlines can be a line of metal or other conductive material deposited along columns and rows of memory cells to allow the memory cells to be individually addressable. Additional structures are sometimes incorporated into the memory array such as conductive vias that penetrate through the substrate on which the memory array is formed.

The various material layers and structures that make up a phase change memory device can present various operational and manufacturing challenges. For example, it can be desirable to make these structures as small as possible in order to make high-density memory. Further, it can be desirable to maximize operational efficiency of individual memory cells. However, this can be balanced against processing limitations and the need for consistent and reliable memory operation.

In certain types of phase change memory, the memory cells can include at least a phase change material layer and a top electrode layer above the phase change material layer. A metal bitline can be deposited over a column of memory cells, but first a metal ceramic composite material layer can be deposited between the electrode layer and the metal bitline.

In some cases, the metal ceramic composite material layer can both reduce programming current and reduce or otherwise minimize resistivity between the top electrode layer and the metal bit line.

A process for manufacturing a phase change memory can include the following steps. First, continuous layers of phase change material and top electrode material can be deposited. Then these layers can be divided into individual memory cells separated by dielectric material. A layer of metal ceramic composite material can then be deposited over the top of the top electrodes and the dielectric material. A metal bitline can be deposited over the metal ceramic composite material layer. Such a process results in a memory structure having a continuous layer of metal ceramic composite material that extends along the top surfaces of the dielectric material and top electrodes of a column of memory cells. However, it has been found that a PCM structure manufactured in this way can have a number of disadvantages, such as higher resistivity between the bitline and one or more vias, for example.

The present disclosure describes PCM cells, structures, systems, and associated methods that can address these disadvantages, as well as providing a PCM cell with good thermal efficiency, minimized programming current, and good material stability. In further detail, PCM cells, as described herein, can include a PCM layer and a first electrode and a second electrode disposed or positioned on opposite sides of the PCM layer. This can be further illustrated in FIGS. 1A-1C.

Figure 1A:
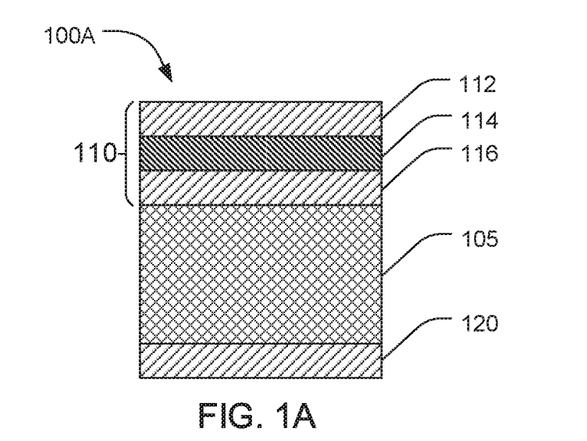
FIG. 1A illustrates a phase change memory (PCM) cell, in accordance with an example embodiment.

For example, FIG. 1A illustrates a PCM cell 100A having a PCM layer 105 and first electrode 110 and a second electrode 120 disposed on opposite sides thereof. In this particular example, the first electrode 110 includes a metal ceramic composite material layer 114 with an upper (or first) barrier layer 112 and a lower (or second) barrier layer 116 disposed on opposite sides thereof.

Figure 1B:
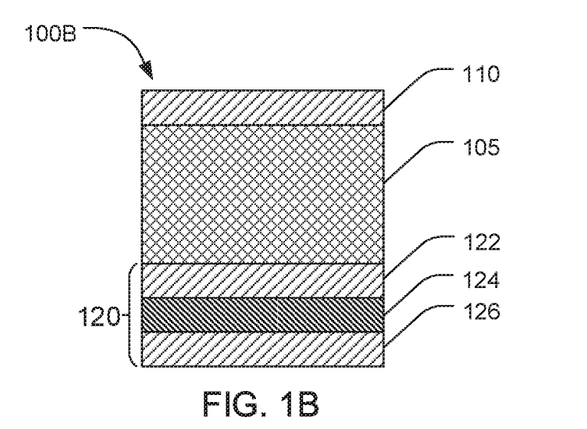
FIG. 1B illustrates a PCM cell, in accordance with an example embodiment.

FIG. 1B also illustrates a PCM cell 100B having a PCM layer 105 and first electrode 110 and a second electrode 120 disposed on opposite sides thereof. However, in this example, the second electrode 120 includes a metal ceramic composite material layer 124 with an upper (or first) barrier layer 122 and a lower (or second) barrier layer 126 disposed on opposite sides thereof, whereas the first electrode 110 does not include a metal ceramic composite material layer.

Figure 1C:
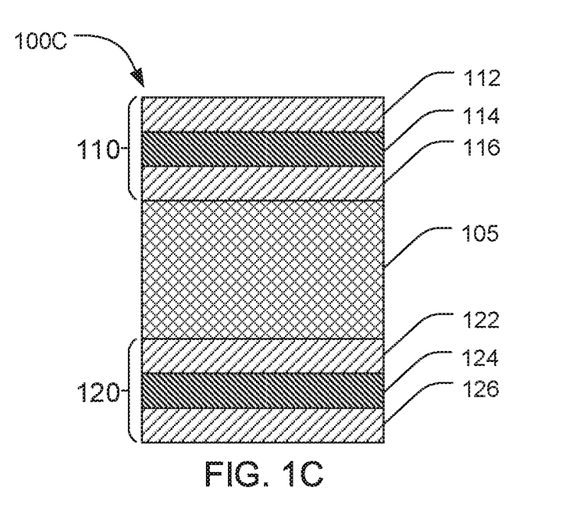
FIG. 1C illustrates a PCM cell, in accordance with an example embodiment.

FIG. 1C illustrates yet another example of a PCM cell 100C having a PCM layer 105 and first electrode 110 and a second electrode 120 disposed on opposite sides thereof. In this example, both the first electrode 110 and the second electrode 120 include a metal ceramic composite material layer. Specifically, the first electrode 110 includes a metal ceramic composite material layer 114 with an upper (or first) barrier layer 112 and a lower (or second) barrier layer 116 disposed on opposite sides thereof. Additionally, the second electrode 120 also includes a metal ceramic composite material layer 124 with an upper (or first) barrier layer 122 and a lower (or second) barrier layer 126 disposed on opposite sides thereof.

FIGS. 1A-1C illustrate example configurations of the PCM cells described herein. Specifically, the first electrode, the second electrode, or both can include a metal ceramic composite layer having an upper barrier layer and a lower barrier layer disposed on opposite sides thereof. Including the metal ceramic composite material in the first electrode, the second electrode, or both can help reduce (e.g. in comparison to electrodes without a metal ceramic composite material) or otherwise minimize the programming current and increase the thermal efficiency of the PCM cell. Also, the corresponding upper and lower barrier layers can help provide additional material stability to the metal ceramic composite material layer.

The PCM layer in the PCM cell can include one or more of a variety of PCM materials. As a general matter, the phase change material can include any useful material having a stable and detectable change in phase. In some examples, the phase change material can include germanium, antimony, tellurium, silicon, nickel, gallium, arsenic, silver, tin, gold, lead, bismuth, indium, yttrium, selenium, scandium, boron, oxygen, sulphur, nitrogen, carbon, the like, or a combination thereof. Specific examples of such a materials can include any of a variety of chalcogenide alloys, including, without limitation, Ge—Te, In—Se, Sb—Te, Ge—Sb, Ga—Sb, In—Sb, As—Te, Al—Te, Ge—Sb—Te, Te—Ge—As, In—Sb—Te, In—Se—Te, Te—Sn—Se, Ge—Se—Ga, Bi—Se—Sb, Ga—Se—Te, Sn—Sb—Te, In—Sb—Ge, Te—Ge—Sb—S, Te—Ge—Sn—O, Te—Ge—Sn—Au, Pd—Te—Ge—Sn, In—Se—Ti—Co, Ge—Sb—Te—Pd, Ge—Sb—Te—Co, Sb—Te—Bi—Se, Ag—In—Sb—Te, Ge—Sb—Se—Te, Ge—Sn—Sb—Te, Ge—Te—Sn—Ni, Ge—Te—Sn—Pd, and Ge—Te—Sn—Pt, among others. The hyphenated chemical composition notation, as used herein, indicates the elements included in a particular mixture or compound, e.g., chalcogenide alloy, and is intended to represent all stoichiometries involving the indicated elements, e.g., $Ge_xSb_y$-$Te_z$ having variations in stoichiometries, such as $Ge_2Sb_2Te_5$, $Ge_2Sb_2Te_7$, $Ge_1Sb_2Te_4$, $Ge_1Sb_4Te_7$, etc., to form a gradient. In some additional examples, the chalcogenide alloy can be doped, such as with indium, yttrium, scandium, boron, nitrogen, oxygen, the like, or a combination thereof.

The first electrode and the second electrode of the PCM cell can each include of a variety of materials, which can also depend on the particular configuration of the electrodes. As described above, the first electrode, the second electrode, or both can be formed of a metal ceramic composite material layer having an upper barrier layer and a lower barrier layer positioned on opposite sides thereof. Where this is the case, the metal ceramic composite material layer can include various combinations of a metal ceramic composite materials. In some examples, the metal ceramic composite material can include tungsten, titanium, tantalum, or the like (e.g. refractory metals, or the like, for example) in combination with silicon, carbon, nitrogen, boron, oxygen, the like, or a combination thereof. It is noted that refractory metals can include titanium, vanadium, chromium, zirconium, niobium, molybdenum, ruthenium, rhodium, hafnium, tantalum, tungsten, rhenium, oxmium, iridium, or a combination thereof. In some examples, the metal ceramic composite material can include any suitable cermet material. In some specific examples, the metal ceramic composite material can include tungsten silicon nitride, tantalum silicon nitride, niobium silicon nitride, molybdenum silicon nitride, titanium silicon nitride, carbon nitride, tungsten carbon nitride, doped alpha silicon, doped alpha germanium, the like, or a combination thereof. In some further examples, the metal ceramic composite material can include tungsten silicon nitride (WSiN). Where this is the case, W can typically be present at from 7 atomic percent (at %) to about 50 at % in the metal ceramic composite material. In some examples, W can be present at from about 10 at % to about 30 at %. Further, Si can typically be present at from about 20 at % to about 60 at % in the metal ceramic composite material. In some further examples, Si can be present at from about 20 at % to about 40 at %.

Altering the thickness of the layer, adjusting the composition of the layer, and positioning of the layer in the first electrode, the second electrode, or both allows the PCM cell to be highly tunable to achieve specific characteristics. Generally, the metal ceramic composite material layer can provide a corresponding electrode with an electrical resistivity of from 10 mOhm-cm to 1000 mOhm-cm. In some examples, the metal ceramic composite material layer can provide a corresponding electrode with an electrical resistivity of from 20 mOhm-cm to 800 mOhm-cm. In some additional examples, the metal ceramic composite material layer can provide a corresponding electrode with an electrical resistivity of from 50 mOhm-cm to 500 mOhm-cm. In still other examples, the metal ceramic composite material layer can provide a corresponding electrode with an electrical resistivity of from 10 mOhm-cm to 200 mOhm-cm.

The metal ceramic composite material layer can have a variety of thicknesses depending on the specific electrical properties desired for the PCM cell. In some examples, the metal ceramic composite material layer can have a thickness of from about 1 nm to about 50 nm.

The upper and lower barrier layers positioned on opposite sides of the metal ceramic composite material layer can provide additional stability to the metal ceramic composite material layer. For example, in some cases, the upper and lower barrier layers can provide thermal stability to the metal ceramic material layer so as to minimize changes in resistivity of the metal ceramic material layer during thermal cycling (e.g. up to 1000-1200 K, for example). Thus, in some examples, the composition of the upper and lower barrier layers can be selected based on their stabilizing properties with respect to the metal ceramic composite material layer. Additionally, adjacent layers can also determine the composition of the upper and lower barrier layers. For example, in some cases, the upper barrier layer of the first electrode can be configured to contact a conductive bitline. Where this is the case, it can be desirable to select a material for the upper barrier layer that minimizes the electrical resistivity between the upper barrier layer and the conductive bitline. In some examples, the upper and lower barrier layers can be formed of the same material. In other examples, the upper and lower barrier layers can be formed of different materials. Generally, the material(s) used for the upper and lower barrier layers can be chemically inert through high temperatures next to other materials in the stack. Non-limiting examples of materials that can be used to form the upper and lower barrier layers can include amorphous carbon, carbon nitride, refractory metals, refractory metal nitrides, refractory metal silicides, refractory metal carbides, refractory metal borides, the like, or a combination thereof.

The upper barrier layer and the lower barrier layer can have a variety of thicknesses. In some examples, the upper barrier layer can have a thickness of from about 5 nm to 100 nm. In some additional examples, the lower barrier layer can have a thickness of from about 5 nm to about 100 nm.

In some examples, one of the first electrode or the second electrode does not include a metal ceramic composite material layer. Where this is the case, the corresponding electrode can include one or more conductive or semiconductive materials. Non-limiting examples can include carbon (C), carbon nitride ($C_xN_y$), n-doped polysilicon, p-doped polysilicon, metals (e.g. Al, Cu, Ni, Cr, Co, Ru, Rh, Pd, Ag, Pt, Au, Ir, Ta, and W, for example), conductive metal nitrides, (e.g. TiN, TaN, WN, and TaCN, for example) conductive metal silicides (e.g. tantalum silicides, tungsten silicides, nickel silicides, cobalt silicides, and titanium silicides, for example), conductive metal silicides nitrides (e.g. TiSiN and WSiN, for example), conductive metal carbide nitrides (e.g. TiCN and WCN, for example), conductive metal oxides (e.g. $RuO_2$, for example), the like, or a combination thereof.

Further, wherein one of the first electrode or the second electrode does not include a metal ceramic composite material layer, the corresponding electrode can typically have a thickness of from about 5 nm to about 100 nm.

The PCM cell can include a variety of additional components, as desired. This can be illustrated in FIG. 2. For example, a PCM cell 200 can include a PCM layer 205. The PCM cell can also include a first electrode 210 and a second electrode 220 disposed on opposite sides of the PCM. In this particular example, both the first electrode 210 and the second electrode 220 can include a metal ceramic composite material layer. Specifically, first electrode 210 includes a first metal ceramic composite material layer 214 having a first upper barrier layer 212 and a first lower barrier layer 216 positioned on opposite sides thereof. The second electrode 220 includes a second metal ceramic composite material layer 224 having a second upper barrier layer 222 and a second lower barrier layer 226 disposed on opposite sides thereof.

Figure 2:
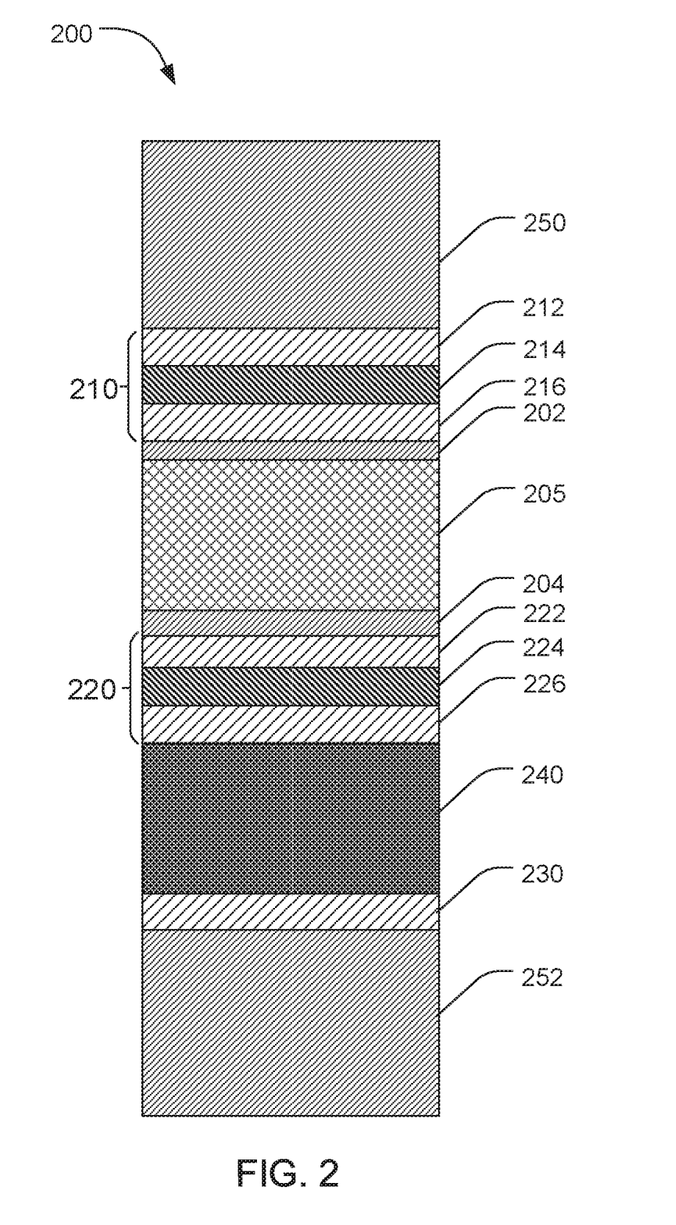
FIG. 2 illustrates a PCM cell, in accordance with an example embodiment.

The PCM cell 200 also includes an upper or first lamina layer 202 disposed between the first electrode 210 and the PCM layer 205. The PCM cell also includes a lower or second lamina layer 204 disposed between the second electrode 220 and the PCM layer 205. These lamina layers can be adhesion layers or can otherwise facilitate a good electrical connection between the PCM layer 205 and the surrounding electrode layers 210, 220. The lamina layers can be formed of a variety of materials. Non-limiting examples can include tungsten, tantalum, titanium, other refractory metals, refractory metal nitrides, refractory metal silicides, refractory metal carbides, refractory metal borides, the like, or a combination thereof.

The PCM cell 200 can also include a select device (SD) layer 240. It is noted that the select device material is generally made of a phase change material, and as such, the materials described herein with respect to the PCM layer are applicable here as well. The actual material used in a given memory structure for the phase change material layer and the SD layer can be different or the same, depending on the design of the device. In another example, the select device material in the SD layer can be a conductor, semiconductor, or dielectric material. Such materials can be selected as needed to perform an intended function in the phase change memory cell.

The PCM cell 200 can also include a third electrode 230. The third electrode can include one or more conductive or semiconductive materials. Non-limiting examples can include carbon (C), carbon nitride ($C_xN_y$), n-doped polysilicon, p-doped polysilicon, metals (e.g. Al, Cu, Ni, Cr, Co, Ru, Rh, Pd, Ag, Pt, Au, Ir, Ta, and W, for example), conductive metal nitrides, (e.g. TiN, TaN, WN, and TaCN, for example) conductive metal silicides (e.g. tantalum silicides, tungsten silicides, nickel silicides, cobalt silicides, and titanium silicides, for example), conductive metal silicides nitrides (e.g. TiSiN and WSiN, for example), conductive metal carbide nitrides (e.g. TiCN and WCN, for example), conductive metal oxides (e.g. $RuO_2$, for example), the like, or a combination thereof.

FIG. 2 also illustrates a bitline 250 and a wordline 252, for example. However, it is noted that these features are presented for context and are not necessarily intended to form part of the individual PCM cell 200. The conductive bitline and wordline can be made of a variety of conductive materials. Non-limiting examples can include tungsten (W), copper (Cu), ruthenium (Ru), tungsten nitride (WN), nickel (Ni), tantalum nitride (TaN), platinum (Pt), gold (Au), titanium nitride (TiN), titanium silicon nitride (TiSiN), titanium aluminum nitride (TiAlN), molybdenum nitride (MoN), the like, or a combination thereof.

Individual PCM cells as described herein can be included in a PCM structure to form an array of PCM cells. The PCM structure can also include an electrical via having a substantially parallel orientation to the array of PCM cells. A dielectric material can be positioned to separate the via from the array of PCM cells and to separate individual PCM cells from one another. A bitline can be formed in direct contact with the via and the first electrode of individual PCM cells. Thus, because of the way individual PCM cells are manufactured, there is no metal ceramic composite material layer positioned between the bitline and the via to increase the electrical resistivity between the bitline and the via. As such the interface resistance between the bitline and via can be less than 0.1 μOhm-cm. In some other examples, the interface resistance between the bitline and via can be less than 0.01 μOhm-cm. In some additional examples, the interface resistance between the bitline and via can be less than 0.001 μOhm-cm. In some further examples, the via can have an electrical resistance of less than 500 ohm.

Figure 3:
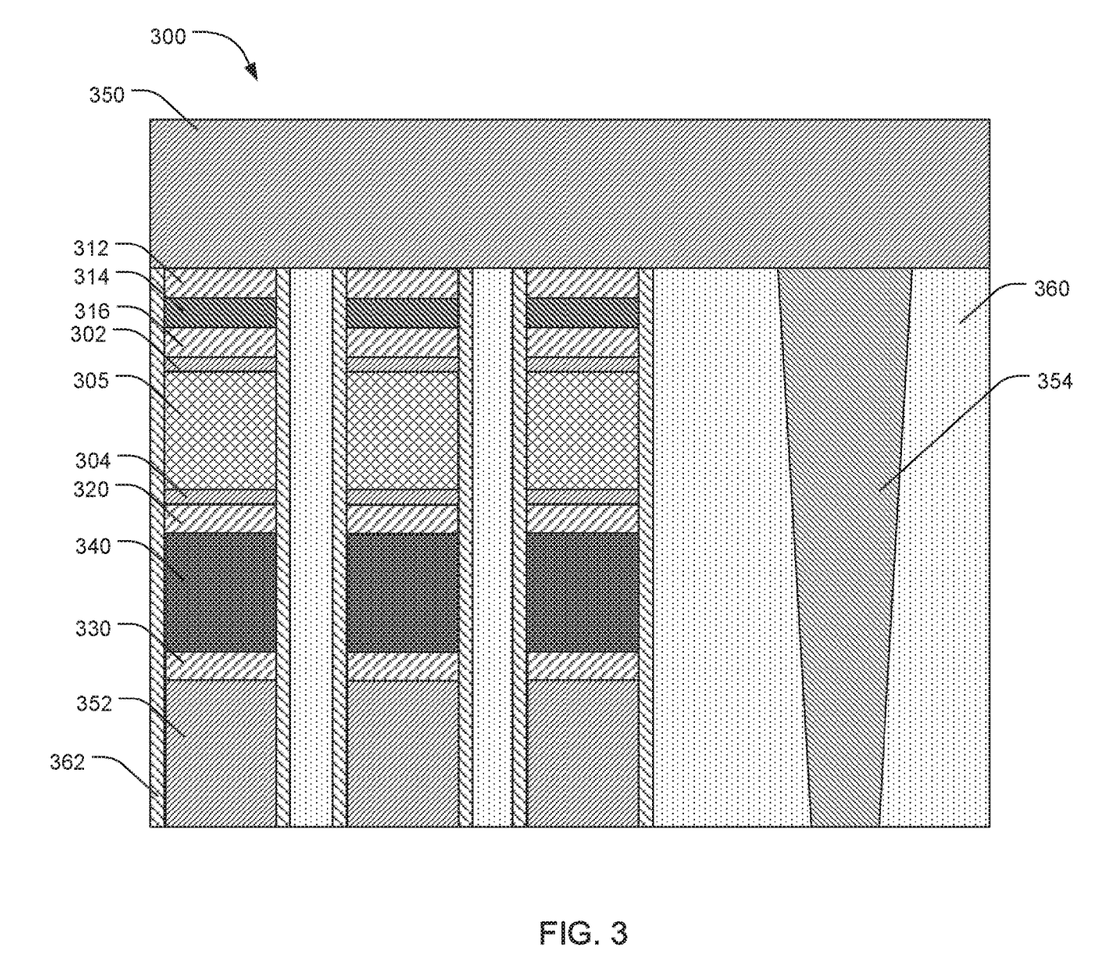
FIG. 3 illustrates a PCM structure, in accordance an example embodiment.

FIG. 3 illustrates one example of a PCM structure 300 having an array of PCM cells as described herein. In this particular example, individual PCM cells include an upper electrode formed by a metal ceramic composite material layer 314 having an upper barrier layer 312 and a lower barrier layer 316 disposed on opposite sides thereof. The individual PCM cells also include a lower electrode 320 that does not include a metal ceramic composite material layer. In alternative embodiments, the lower electrode only, or both the upper and lower electrodes can have the above-recited composite structure. An upper lamina layer 302 is positioned between the PCM layer 305 and the lower electrode barrier 316 of the first electrode. A lower lamina layer 304 is positioned between the PCM layer 305 and the second electrode 320. The second electrode 320 is disposed on an SD layer 340. The SD layer 340 is positioned on a third electrode layer 330. Each individual PCM cell is formed on a respective wordline 352.

A via 354 is also formed in a substantially parallel orientation to the array of PCM cells. The via can typically be formed of the same types of materials used to form wordlines or bitlines. Non-limiting examples can include tungsten (W), tungsten nitride (WN), nickel (Ni), tantalum nitride (TaN), platinum (Pt), gold (Au), titanium nitride (TiN), titanium silicon nitride (TiSiN), titanium aluminum nitride (TiAlN), molybdenum nitride (MoN), the like, or a combination thereof. In some examples, the via can be formed of the same material as the bitline. In some examples, the via can be formed of a different material from the bitline.

A dielectric material 360 can be positioned between the array of PCM cells and between individual PCM cells. In some examples, the dielectric material can include silicon oxide, silicon nitride, silicon oxy-carbide, spin-on-glass, organic polymer, organic/inorganic co-polymer, or other suitable dielectric material. It is also noted that a second dielectric material 362 can be used to encapsulate or further isolate individual PCM cells. In some examples, the second dielectric material can include silicon nitride (e.g. $Si_3N_4$ or in general $Si_xN_y$, where x and y represent any suitable relative quantity) silicon oxide, silicon oxy-carbide, spin-on-glass, organic polymer, organic/inorganic co-polymer, or other suitable dielectric material.

A bitline 350 can be formed in direct contact with the upper electrode (in this case the upper barrier layer 312 of the upper electrode) and the via 354. Thus, the electrical resistivity between the bitline and the via can be minimized, as described above.

Figure 4:
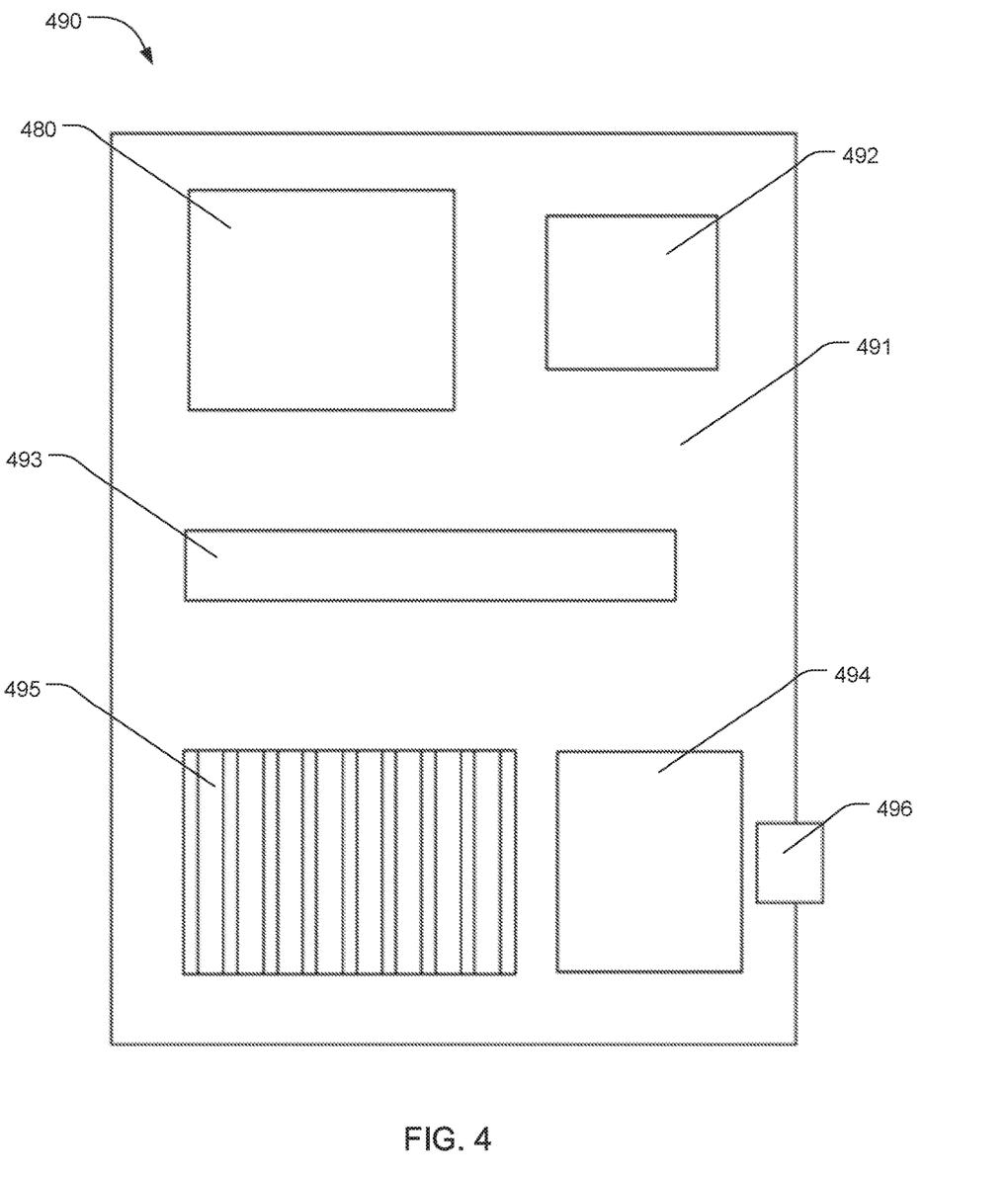
FIG. 4 illustrates a computing system, in accordance with an example embodiment.

In some examples, a PCM structure as described herein can be included in a computing system. As illustrated in FIG. 4, computing system 490 can include a motherboard 491 and a PCM structure, array, or device 480 as described herein that is operably coupled to the motherboard 491. In one aspect, a computing system 490 can also include a processor 492, a memory device 493, a radio 494, a heat sink 495, a port 496, a slot, or any other suitable device or component, which can be operably coupled to the motherboard 491. The computing system 490 can comprise any type of computing system, such as a desktop computer, a laptop computer, a tablet computer, a smartphone, a wearable device, a server, etc. Other embodiments need not include all of the features specified in FIG. 4, and may include alternative features not specified in FIG. 4.

Circuitry used in electronic components or devices (e.g. a die) of a PCM structure can include hardware, firmware, program code, executable code, computer instructions, and/or software. Electronic components and devices can include a non-transitory computer readable storage medium which can be a computer readable storage medium that does not include signal. In the case of program code execution on programmable computers, the computing systems recited herein may include a processor, a storage medium readable by the processor (including volatile and non-volatile memory and/or storage elements), at least one input device, and at least one output device. Volatile and non-volatile memory and/or storage elements may be a RAM, EPROM, flash drive, optical drive, magnetic hard drive, solid state drive, or other medium for storing electronic data. Node and wireless devices may also include a transceiver module, a counter module, a processing module, and/or a clock module or timer module. One or more programs that may implement or utilize any techniques described herein may use an application programming interface (API), reusable controls, and the like. Such programs may be implemented in a high level procedural or object oriented programming language to communicate with a computer system. However, the program(s) may be implemented in assembly or machine language, if desired. In any case, the language may be a compiled or interpreted language, and combined with hardware implementations.

As described above, the PCM cells described herein can have good thermal stability. Thus, the present disclosure also describes methods of maximizing a thermal stability of a PCM cell. The methods can include disposing a first electrode and a second electrode on opposite sides of a PCM layer. The first electrode, the second electrode, or both can include a metal ceramic composite material layer having an electrical resistivity of from about 10 mOhm-cm to about 1000 mOhm-cm.

The metal ceramic composite material layer can be positioned between an upper barrier layer and a lower barrier layer. These barrier layers can help provide thermal stability for the metal ceramic composite material layer. The specific details about the metal ceramic composite material layer and associated barrier layers is described elsewhere herein. Other details about the PCM cell are also described elsewhere herein.

The present disclosure also describes methods of manufacturing a PCM structure, array, or device. Generally, the methods can include forming a PCM cell stack including one or more second electrode layers, a PCM layer disposed on the one or more second electrode layers, and one or more first electrode layers disposed on the PCM layer. The one or more second electrode layers, the one or more first electrode layers, or both can include a metal ceramic composite material layer disposed between an upper barrier layer and a lower barrier layer. A plurality of individual PCM cells can be separated by forming a trench between individual cells. A dielectric material can be positioned, formed, or deposited to electrically insulate individual PCM cells from one another. An electrical via can be formed within a portion of the formed dielectric material. The via can have an orientation that is substantially parallel to the individual PCM cells. A bitline can be formed in contacted with the plurality of individual PCM cells and the via. The interface resistance between the bitline and via can be less than 0.1 µOhm-cm.

Figure 5A:
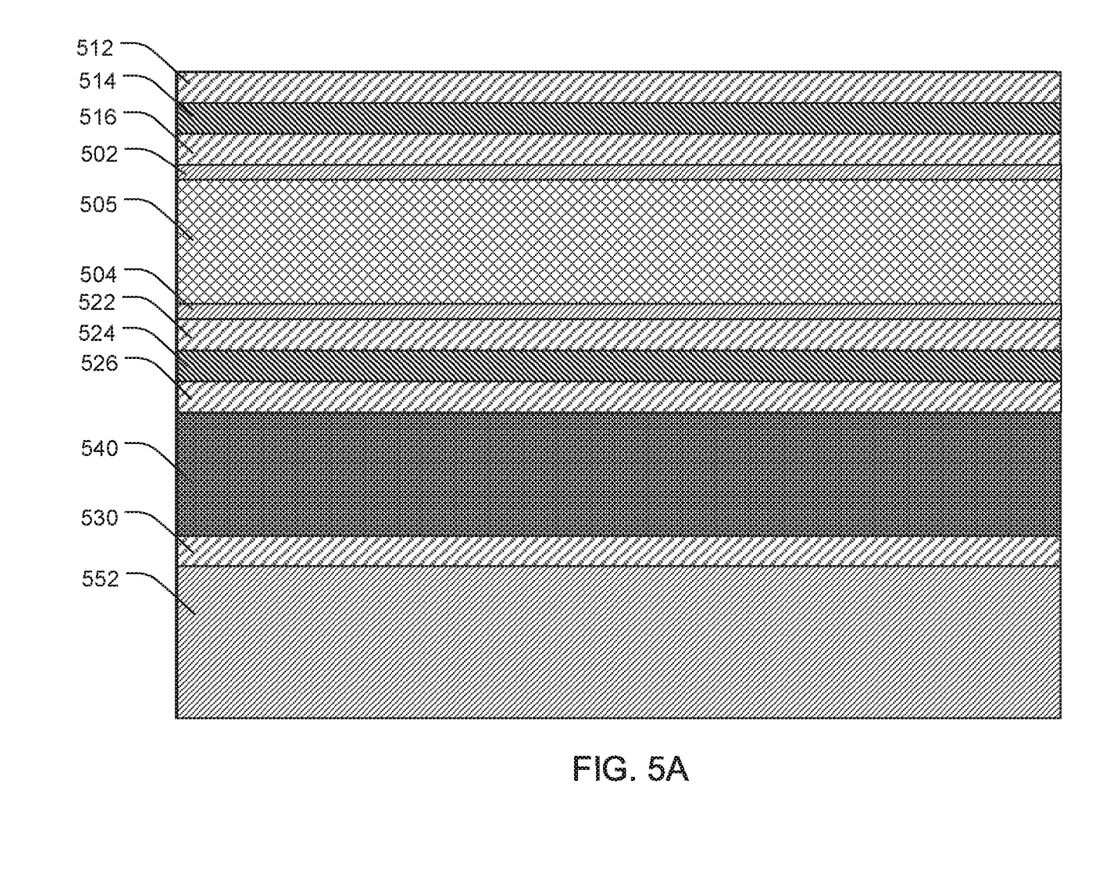
FIG. 5A illustrates a PCM structure at one stage of manufacturing, in accordance an example embodiment.

One exemplary method of manufacturing a PCM structure is depicted in FIGS. 5A-5D. FIG. 5A illustrates a PCM stack. The various layers of the PCM stack can be formed using any suitable methodology, such as chemical vapor deposition (CVD), physical vapor depositions (PVD), atomic layer deposition (ALD), the like, or a combination thereof. Specifically, FIG. 5A illustrates a stack including a wordline layer 552, a third electrode layer 530, disposed on the wordline layer 552, and an SD layer 540 disposed on the third electrode layer 530. A plurality of second electrode layers are disposed on the SD layer 540. More specifically, the plurality of second electrode layers includes a second metal ceramic composite material layer 524 having a second upper barrier layer 522 and a second lower barrier layer 526 positioned on opposite sides thereof. A PCM layer 505 is positioned on the plurality of second electrode layers, being sandwiched between an upper or first lamina layer 502 and a lower or second lamina layer 504. A plurality of first electrode layers is positioned on the PCM layer 505. The plurality of first electrode layers includes a first metal ceramic composite material layer 114 having a first upper barrier layer 112 and a first lower barrier layer 116 positioned on opposite sides thereof. Thus, in this particular example, both the first and second electrodes include the metal ceramic composite material layer. However, this is not required, as illustrated in FIGS. 1A-1B and FIG. 3.

Figure 5B:
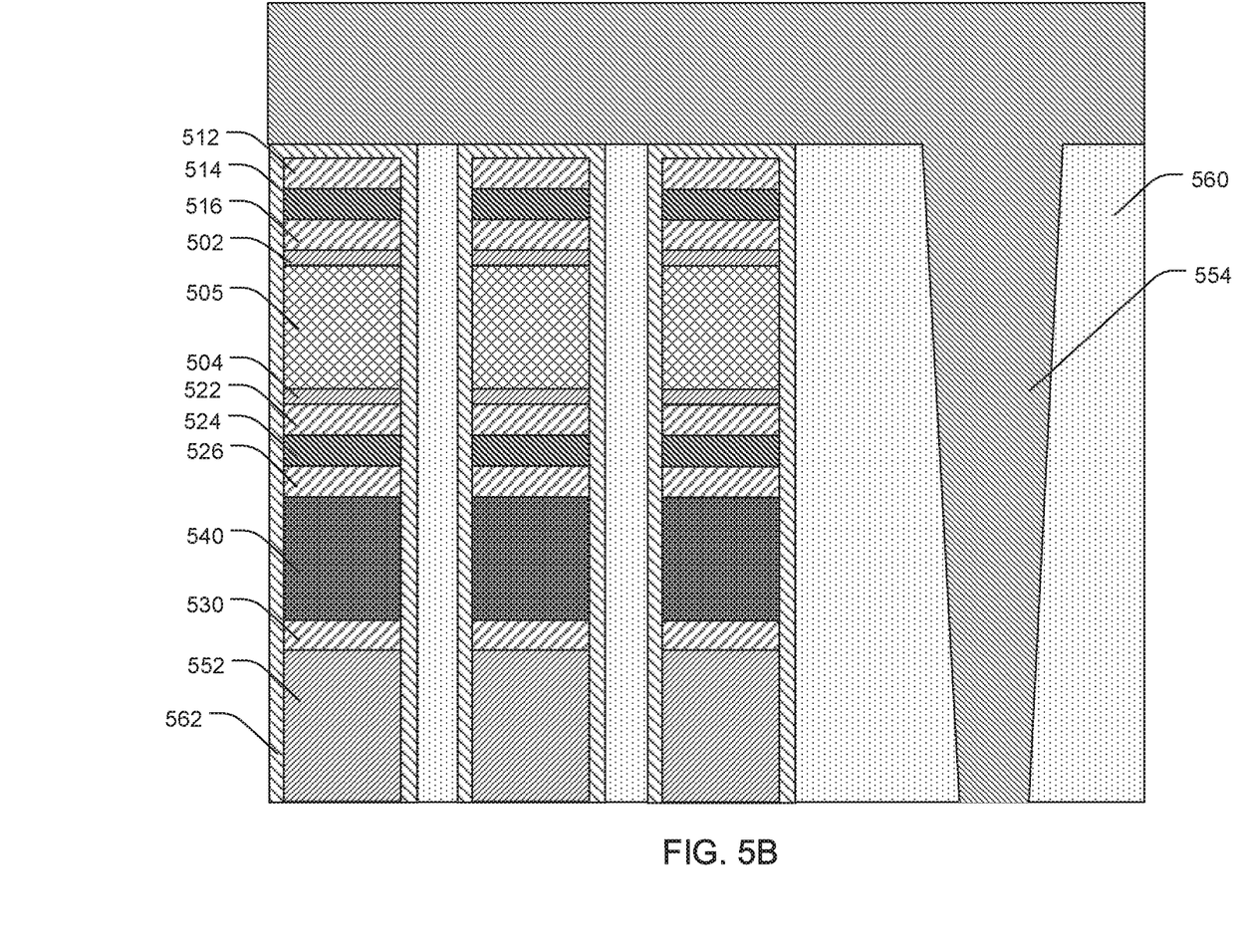
FIG. 5B illustrates a PCM structure at one stage of manufacturing, in accordance with an example embodiment.

Turning now to FIG. 5B, individual PCM cells can be separated by forming a trench(s) to define individual PCM cells or stacks. The trenches can be formed by any suitable methodology, such as dry etching, wet etching, lithography, the like, or a combination thereof. A conformal dielectric liner 562 can be used to line or encapsulate individual PCM cells. Any suitable technique to deposit or otherwise form the conformal dielectric liner 562 can be employed. A dielectric filler material 560 can be positioned between individual PCM cells. A via trench can be formed in the dielectric filler material 560 and filled in with a conductive material to form via 554. The via 554 can have a substantially parallel orientation to the array of PCM cells.

Figure 5C:
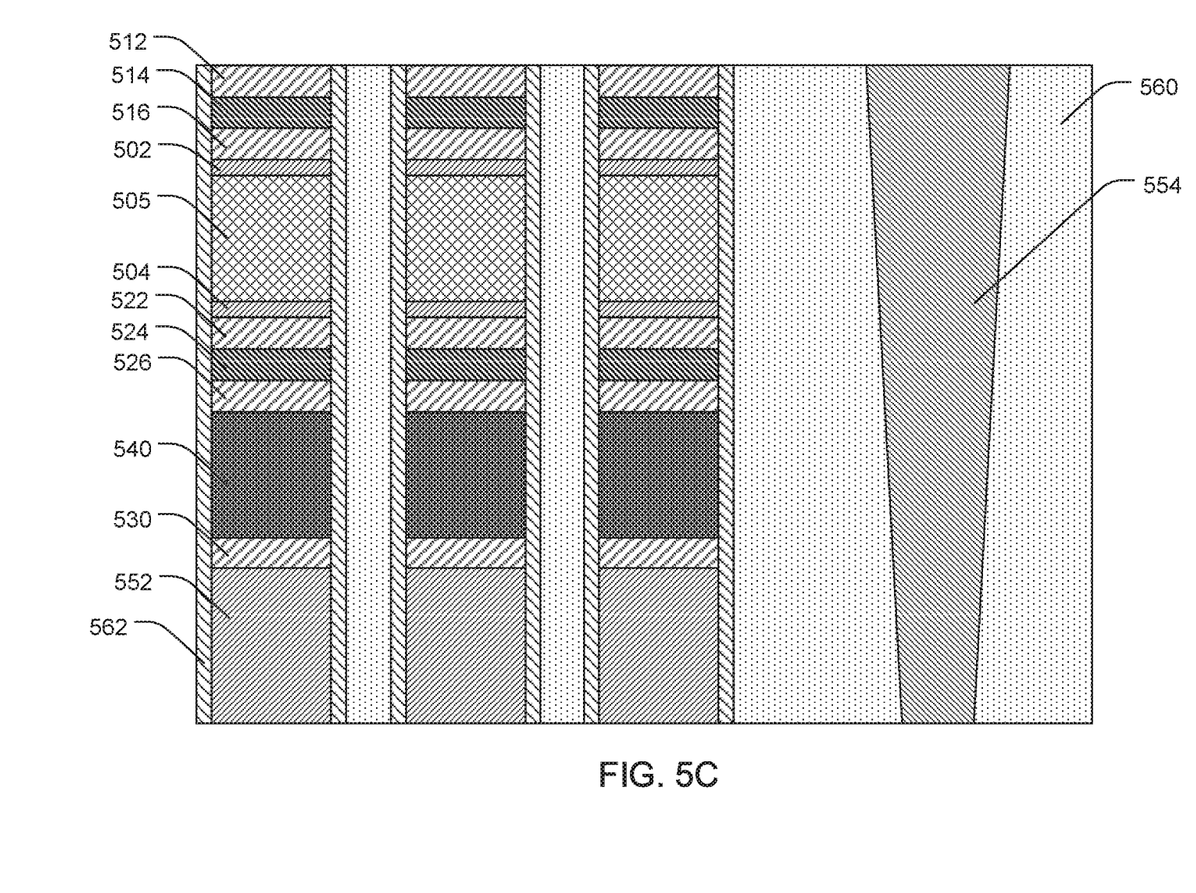
FIG. 5C illustrates a PCM structure at one stage of manufacturing, in accordance with an example embodiment.
Figure 5D:
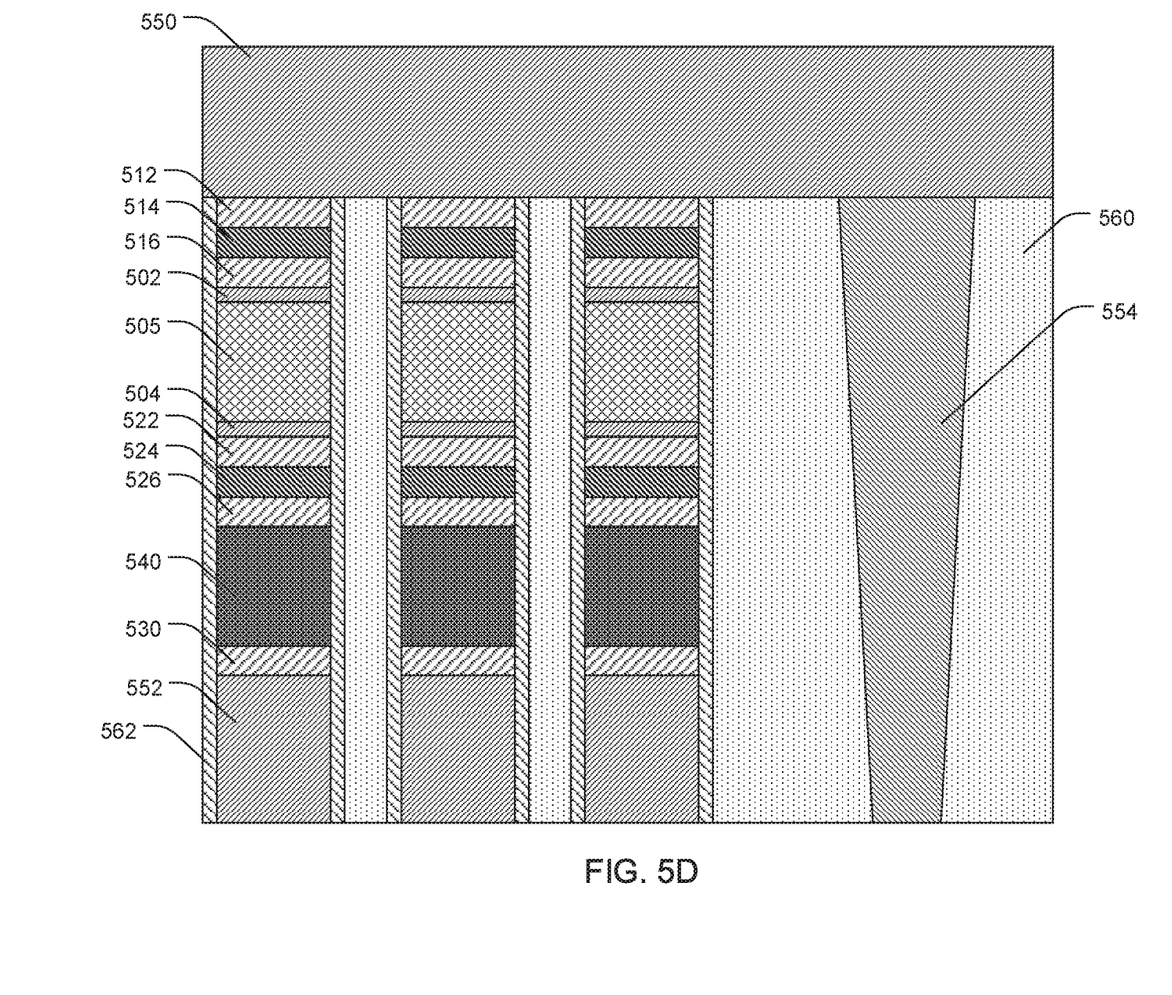
FIG. 5D illustrates a PCM structure at one stage of manufacturing, in accordance with an example embodiment.

FIG. 5C illustrates the PCM structure after residual via material and an upper portion of the conformal dielectric liner has been removed. This can be performed by chemical mechanical planarization (CMP) or other suitable polishing technique. FIG. 5D illustrates the PCM structure after forming a bitline 550 in contact with the plurality of individual PCM cells and the via 554. Specifically, the bitline 550 is in direct contact with the first upper barrier layer 512 of individual PCM cells and the via 554. Further, because the bitline 550 and via 554 are in direct contact without an intervening metal ceramic composite layer, the electrical resistivity of the bitline-via electrical connection is minimized in this PCM structure. It is noted that, in some examples, the bitline and the via can be formed of the same material. Where this is the case, in some examples, the bitline and the via can be formed or deposited using alternative techniques. For example, the via can be formed using CVD whereas the bitline can be formed using PVD. In still other examples, the bitline and the via can be formed of different materials.

Examples

In one example there is provided, a phase change memory (PCM) cell comprising, a PCM layer comprising a PCM material, and a first electrode and a second electrode disposed on opposite sides of the PCM layer, wherein the first electrode, the second electrode, or both includes a metal ceramic composite material layer disposed between an upper barrier layer and a lower barrier.

In one example of a PCM cell, the PCM material comprises germanium, antimony, tellurium, silicon, nickel, gallium, arsenic, silver, tin, gold, lead, bismuth, indium, selenium, oxygen, sulphur, nitrogen, carbon, or a combination thereof.

In one example of a PCM cell, the PCM cell can further include a first lamina layer disposed between the PCM layer and the first electrode.

In one example of a PCM cell, the first lamina layer comprises a refractory metal, a refractory metal nitride, a refractory metal silicide, a refractory metal carbide, a refractory metal boride, or a combination thereof.

In one example of a PCM cell, the PCM cell can further include a second lamina layer disposed between the PCM layer and the second electrode.

In one example of a PCM cell, the second lamina layer comprises a refractory metal, a refractory metal nitride, a refractory metal silicide, a refractory metal carbide, a refractory metal boride, or a combination thereof.

In one example of a PCM cell, the first electrode includes the metal ceramic composite material layer disposed between the upper barrier layer and the lower barrier layer.

In one example of a PCM cell, the metal ceramic composite material layer of the first electrode is a metal silicon nitride and the upper barrier layer and the lower barrier individually comprise carbon.

In one example of a PCM cell, the second electrode includes the metal ceramic composite material layer disposed between the upper barrier layer and the lower barrier layer.

In one example of a PCM cell, the metal ceramic composite material layer of the second electrode is a metal silicon nitride and the upper barrier layer and the lower barrier individually comprise carbon.

In one example of a PCM cell, the first electrode and the second electrode each include individual metal ceramic composite material layers disposed between individual upper barrier layers and lower barrier layers.

In one example of a PCM cell, the individual metal ceramic composite material layers individually comprise a metal silicon nitride and the individual upper barrier layers and lower barrier layers individually comprise carbon.

In one example of a PCM cell, the metal ceramic composite material layer provides a corresponding electrode with an electrical resistivity of from 10 mOhm-cm to 1000 mOhm-cm.

In one example of a PCM cell, the metal ceramic composite material layer comprises tungsten silicon nitride, tantalum silicon nitride, niobium silicon nitride, molybdenum silicon nitride, titanium silicon nitride, carbon nitride, tungsten carbon nitride, doped alpha silicon, doped alpha germanium, or a combination thereof.

In one example of a PCM cell, the metal ceramic composite material layer comprises tungsten silicon nitride (WSiN) and W is present at from about 7 atomic percent (at %) to about 50 at % and Si is present at from about 20 at % to about 60 at %.

In one example of a PCM cell, the metal ceramic composite material layer has a thickness of from 1 nm to 50 nm.

In one example of a PCM cell, the upper barrier layer comprises amorphous carbon, carbon nitride, a refractory metal, a refractory metal nitride, a refractory metal silicide, a refractory metal carbide, a refractory metal boride, or a combination thereof.

In one example of a PCM cell, the upper barrier layer has a thickness of from 5 nm to 100 nm.

In one example of a PCM cell, the lower barrier layer comprises amorphous carbon, carbon nitride, a refractory metal, a refractory metal nitride, a refractory metal silicide, a refractory metal carbide, a refractory metal boride, or a combination thereof.

In one example of a PCM cell, the lower barrier layer has a thickness of from 5 nm to 100 nm.

In one example of a PCM cell, the second electrode is positioned between the PCM layer and a select device layer.

In one example of a PCM cell, the select device layer is positioned between the second electrode and a third electrode.

In one example there is provided, a phase change memory (PCM) structure comprising, an array of PCM cells, individually including a PCM layer comprising a PCM material, and a first electrode and a second electrode disposed on opposite sides of the PCM layer, wherein the first electrode, the second electrode, or both includes a metal ceramic composite material layer disposed between an upper barrier layer and a lower barrier layer and wherein the metal ceramic composite material layer, and a via having a substantially parallel orientation to the array of PCM cells, a dielectric material separating the via from the array of PCM cells and separating individual PCM cells, and a bitline in direct contact with the via and the first electrode of the individual PCM cells, and wherein an interface resistance between the bitline and the via is less than 0.1 µOhm-cm.

In one example of a PCM structure, the PCM material comprises germanium, antimony, tellurium, silicon, nickel, gallium, arsenic, silver, tin, gold, lead, bismuth, indium, selenium, oxygen, sulphur, nitrogen, carbon, or a combination thereof.

In one example of a PCM structure, the PCM structure further includes a first lamina layer disposed between the PCM layer and the first electrode of individual PCM cells.

In one example of a PCM structure, the first lamina layer comprises a refractory metal, a refractory metal nitride, a refractory metal silicide, a refractory metal carbide, a refractory metal boride, or a combination thereof.

In one example of a PCM structure, the PCM structure further includes a second lamina layer disposed between the PCM layer and the second electrode of individual PCM cells.

In one example of a PCM structure, the second lamina layer comprises a refractory metal, a refractory metal nitride, a refractory metal silicide, a refractory metal carbide, a refractory metal boride, or a combination thereof.

In one example of a PCM structure, the first electrode includes the metal ceramic composite material layer disposed between the upper barrier layer and the lower barrier layer.

In one example of a PCM structure, the metal ceramic composite material layer of the first electrode is a metal silicon nitride and the upper barrier layer and the lower barrier individually comprise carbon.

In one example of a PCM structure, the second electrode includes the metal ceramic composite material layer disposed between the upper barrier layer and the lower barrier layer.

In one example of a PCM structure, the metal ceramic composite material layer of the second electrode is a metal silicon nitride and the upper barrier layer and the lower barrier individually comprise carbon.

In one example of a PCM structure, the first electrode and the second electrode each include individual metal ceramic composite material layers disposed between individual upper barrier layers and lower barrier layers.

In one example of a PCM structure, the individual metal ceramic composite material layers individually comprise a metal silicon nitride and the individual upper barrier layers and lower barrier layers individually comprise carbon.

In one example of a PCM structure, the metal ceramic composite material layer provides a corresponding electrode with an electrical resistivity of from 10 mOhm-cm to 1000 mOhm-cm.

In one example of a PCM structure, the metal ceramic composite material layer comprises tungsten silicon nitride, tantalum silicon nitride, niobium silicon nitride, molybdenum silicon nitride, titanium silicon nitride, carbon nitride, tungsten carbon nitride, doped alpha silicon, doped alpha germanium, or a combination thereof.

In one example of a PCM structure, the metal ceramic composite material layer comprises tungsten silicon nitride (WSiN) and W is present at from about 7 atomic percent (at %) to about 50 at % and Si is present at from about 20 at % to about 60 at %.

In one example of a PCM structure, the metal ceramic composite material layer has a thickness of from 1 nm to 50 nm.

In one example of a PCM structure, the upper barrier layer comprises amorphous carbon, carbon nitride, a refractory metal, a refractory metal nitride, a refractory metal silicide, a refractory metal carbide, a refractory metal boride, or a combination thereof.

In one example of a PCM structure, the upper barrier layer has a thickness of from 5 nm to 100 nm.

In one example of a PCM structure, the lower barrier layer comprises amorphous carbon, carbon nitride, a refractory metal, a refractory metal nitride, a refractory metal silicide, a refractory metal carbide, a refractory metal boride, or a combination thereof.

In one example of a PCM structure, the lower barrier layer has a thickness of from 5 nm to 100 nm.

In one example of a PCM structure, the second electrode is positioned between the PCM layer and a select device layer of individual PCM cells.

In one example of a PCM structure, the select device layer is positioned between the second electrode and a third electrode of individual PCM cells.

In one example of a PCM structure, the via comprises tungsten (W), tungsten nitride (WN), nickel (Ni), tantalum nitride (TaN), platinum (Pt), gold (Au), titanium nitride (TiN), titanium silicon nitride (TiSiN), titanium aluminum nitride (TiAlN), molybdenum nitride (MoN), or a combination thereof.

In one example of a PCM structure, the dielectric material comprises silicon oxide, silicon nitride, silicon oxy-carbide, spin-on-glass, organic polymer, organic/inorganic co-polymer, or other combination thereof.

In one example of a PCM structure, the PCM structure further includes a second dielectric material disposed between individual PCM cells.

In one example of a PCM structure, the second dielectric material comprises silicon oxide, silicon nitride, silicon oxy-carbide, spin-on-glass, organic polymer, organic/inorganic co-polymer, or other combination thereof.

In one example of a PCM structure, the bitline comprises tungsten (W), tungsten nitride (WN), nickel (Ni), tantalum nitride (TaN), platinum (Pt), gold (Au), titanium nitride (TiN), titanium silicon nitride (TiSiN), titanium aluminum nitride (TiAlN), molybdenum nitride (MoN), or a combination thereof.

In one example of a PCM structure, the bitline and the via are formed of the same material.

In one example of a PCM structure, the bitline and the via are formed of different materials.

In one example there is provide, a computing system comprising a motherboard and a PCM memory structure as described herein operably coupled to the motherboard.

In one example of a computing system, the computing system comprises a desktop computer, a laptop computer, a tablet, a smartphone, a wearable device, a server, or a combination thereof.

In one example of a computing system, the computing system further comprises a processor, a memory device, a heat sink, a radio, a slot, a port, or a combination thereof operably coupled to the motherboard.

In one example there is provided, a method of maximizing a thermal stability of a phase change memory (PCM) cell comprising disposing a first electrode and a second electrode on opposite sides of a PCM layer, wherein the first electrode, the second electrode, or both includes a metal ceramic composite material layer.

In one example of maximizing the thermal stability of a PCM cell, the first electrode includes the metal ceramic composite material layer disposed between the upper barrier layer and the lower barrier layer.

In one example of maximizing the thermal stability of a PCM cell, the metal ceramic composite material layer of the first electrode is a metal silicon nitride and the upper barrier layer and the lower barrier individually comprise carbon.

In one example of maximizing the thermal stability of a PCM cell, the second electrode includes the metal ceramic composite material layer disposed between the upper barrier layer and the lower barrier layer.

In one example of maximizing the thermal stability of a PCM cell, the metal ceramic composite material layer of the first electrode is a metal silicon nitride and the upper barrier layer and the lower barrier individually comprise carbon.

In one example of maximizing the thermal stability of a PCM cell, the first electrode and the second electrode each include individual metal ceramic composite material layers disposed between individual upper barrier layers and lower barrier layers.

In one example of maximizing the thermal stability of a PCM cell, the individual metal ceramic composite material layers individually comprise a metal silicon nitride and the individual upper barrier layers and lower barrier layers individually comprise carbon.

In one example of maximizing the thermal stability of a PCM cell, the metal ceramic composite material layer provides a corresponding electrode with an electrical resistivity of from 10 mOhm-cm to 1000 mOhm-cm.

In one example of maximizing the thermal stability of a PCM cell, the metal ceramic composite material layer comprises tungsten silicon nitride, tantalum silicon nitride, niobium silicon nitride, molybdenum silicon nitride, titanium silicon nitride, carbon nitride, tungsten carbon nitride, doped alpha silicon, doped alpha germanium, or a combination thereof.

In one example of maximizing the thermal stability of a PCM cell, the metal ceramic composite material layer comprises tungsten silicon nitride (WSiN) and W is present at from about 7 atomic percent (at %) to about 50 at % and Si is present at from about 20 at % to about 60 at %.

In one example of maximizing the thermal stability of a PCM cell, the metal ceramic composite material layer has a thickness of from 1 nm to 50 nm.

In one example of maximizing the thermal stability of a PCM cell, the upper barrier layer comprises amorphous carbon, carbon nitride, a refractory metal, a refractory metal nitride, a refractory metal silicide, a refractory metal carbide, a refractory metal boride, or a combination thereof.

In one example of maximizing the thermal stability of a PCM cell, the upper barrier layer has a thickness of from 5 nm to 100 nm.

In one example of maximizing the thermal stability of a PCM cell, the lower barrier layer comprises amorphous carbon, carbon nitride, a refractory metal, a refractory metal nitride, a refractory metal silicide, a refractory metal carbide, a refractory metal boride, or a combination thereof.

In one example of maximizing the thermal stability of a PCM cell, the lower barrier layer has a thickness of from 5 nm to 100 nm.

In one examples there is provided, a method of manufacturing a phase change memory (PCM) structure comprising, forming a PCM cell stack comprising one or more second electrode layers, a PCM layer disposed on the one or more second electrode layers, and one or more first electrode layers disposed on the PCM layer, wherein the one or more second electrode layers, the one or more first electrode layers, or both includes a metal ceramic composite material layer disposed between an upper barrier layer and a lower barrier layer, and defining a plurality of individual PCM cells by forming a trench between individual PCM cells, forming a dielectric material to electrically insulate individual PCM cells from one another, forming a via within a portion of the formed dielectric material, said via having an orientation that is substantially parallel to the individual PCM cells, and forming a bit line in contact with the plurality of individual PCM cells and the via.

In one example of manufacturing a PCM structure, the interface resistance between the bitline and the via is less than 0.1 µOhm-cm In one example of manufacturing a PCM structure, the one or more first electrode layers includes the metal ceramic composite material layer disposed between the upper barrier layer and the lower barrier layer.

In one example of manufacturing a PCM structure, the one or more second electrode layers includes the metal ceramic composite material layer disposed between the upper barrier layer and the lower barrier layer.

In one example of manufacturing a PCM structure, the one or more first electrode layers includes the metal ceramic composite material layer disposed between the upper barrier layer and lower barrier layer and the one or more second electrode layers includes the metal ceramic composite material layer disposed between the upper barrier layer and lower barrier layer.

In one example of manufacturing a PCM structure, the metal ceramic composite material layer comprises tungsten silicon nitride, tantalum silicon nitride, niobium silicon nitride, molybdenum silicon nitride, titanium silicon nitride, carbon nitride, tungsten carbon nitride, doped alpha silicon, doped alpha germanium, or a combination thereof.

In one example of manufacturing a PCM structure, the metal ceramic composite material layer comprises tungsten silicon nitride (WSiN) and W is present at from about 7 atomic percent (at %) to about 50 at % and Si is present at from about 20 at % to about 60 at %.

In one example of manufacturing a PCM structure, the metal ceramic composite material layer has a thickness of from 1 nm to 50 nm.

In one example of manufacturing a PCM structure, the upper barrier layer comprises amorphous carbon, carbon nitride, a refractory metal, a refractory metal nitride, a refractory metal silicide, a refractory metal carbide, a refractory metal boride, or a combination thereof.

In one example of manufacturing a PCM structure, the upper barrier layer has a thickness of from 5 nm to 100 nm.

In one example of manufacturing a PCM structure, the lower barrier layer comprises amorphous carbon, carbon nitride, a refractory metal, a refractory metal nitride, a refractory metal silicide, a refractory metal carbide, a refractory metal boride, or a combination thereof.

In one example of manufacturing a PCM structure, the lower barrier layer has a thickness of from 5 nm to 100 nm.

In one example of manufacturing a PCM structure, the method further includes forming a first lamina layer between the one or more first electrode layers and the PCM layer.

In one example of manufacturing a PCM structure, the method further includes forming a second lamina layer between the one or more second electrode layers and the PCM layer.

In one example of manufacturing a PCM structure, the method further includes depositing a second dielectric material between individual PCM cells.

In one example of manufacturing a PCM structure, the one or more second electrode layers are positioned between the PCM layer and a select device layer.

In one example of manufacturing a PCM structure, the select device layer is formed between the one or more second electrode layers and a third electrode layer.

In one example of manufacturing a PCM structure, the third electrode layer are electrically coupled to a wordline.

In one example of manufacturing a PCM structure, the one or more first electrode layers are positioned between the PCM layer and the bitline.

While the forgoing examples are illustrative of the principles of the present technology in one or more particular applications, it will be apparent to those of ordinary skill in the art that numerous modifications in form, usage and details of implementation can be made without the exercise of inventive faculty, and without departing from the principles and concepts of the technology.

What is claimed is:

1. A phase change memory (PCM) cell, comprising:
   a PCM layer comprising a PCM material;
   a first electrode and a second electrode disposed on opposite sides of the PCM layer;
      wherein each of the first electrode and the second electrode includes an upper barrier layer, a lower barrier layer, and a metal ceramic composite material layer disposed between and in direct contact with the upper barrier layer and the lower barrier layer, wherein a composition of the upper barrier layer and a composition of the lower barrier layer are selected to provide thermal stability to the metal ceramic composite material layer,
      wherein said each of the first electrode and the second electrode includes only layers superimposed on one another, and
      wherein the metal ceramic composite material layer is made of a material different from a material of upper barrier layer and lower barrier layer; and
   a first lamina layer disposed between the PCM layer and the first electrode.

2. The PCM cell of claim 1, wherein the PCM material comprises germanium, antimony, tellurium, silicon, nickel, gallium, arsenic, silver, tin, gold, lead, bismuth, indium, selenium, oxygen, sulphur, nitrogen, carbon, or a combination thereof.

3. The PCM cell of claim 1, wherein the first lamina layer comprises a refractory metal, a refractory metal nitride, a refractory metal silicide, a refractory metal carbide, a refractory metal boride, or a combination thereof.

4. The PCM cell of claim 1, further comprising a second lamina layer disposed between the PCM layer and the second electrode.

5. The PCM cell of claim 4, wherein the second lamina layer comprises a refractory metal, a refractory metal nitride, a refractory metal silicide, a refractory metal carbide, a refractory metal boride, or a combination thereof.

6. The PCM cell of claim 1, wherein the metal ceramic composite material layer of at least one of the first electrode or the second electrode is a metal silicon nitride and the upper barrier layer of at least one of the first electrode or the second electrode and the lower barrier of at least one of the first electrode or the second electrode individually comprise carbon.

7. The PCM cell of claim 1, wherein at least one of the first electrode or the second electrode has an electrical resistivity of from 10 mOhm-cm to 1000 mOhm-cm.

8. The PCM cell of claim 1, wherein the metal ceramic composite material layer of at least one of the first electrode or the second electrode comprises tungsten silicon nitride, tantalum silicon nitride, niobium silicon nitride, molybdenum silicon nitride, titanium silicon nitride, carbon nitride, tungsten carbon nitride, doped alpha silicon, doped alpha germanium, or a combination thereof.

9. The PCM cell of claim 1, wherein the metal ceramic composite material layer comprises tungsten silicon nitride (WSiN) and W is present at from about 7 atomic percent (at %) to about 50 at % and Si is present at from about 20 at % to about 60 at %.

10. The PCM cell of claim 1, wherein the metal ceramic composite material layer has a thickness of from 1 nm to 50 nm.

11. The PCM cell of claim 1, wherein the upper barrier layer comprises amorphous carbon, carbon nitride, a refractory metal, a refractory metal nitride, a refractory metal silicide, a refractory metal carbide, a refractory metal boride, or a combination thereof.

12. The PCM cell of claim 1, wherein the upper barrier layer has a thickness of from 5 nm to 100 nm.

13. The PCM cell of claim 1, wherein the lower barrier layer comprises amorphous carbon, carbon nitride, a refractory metal, a refractory metal nitride, a refractory metal silicide, a refractory metal carbide, a refractory metal boride, or a combination thereof.

14. The PCM cell of claim 1, wherein the lower barrier layer has a thickness of from 5 nm to 100 nm.

15. The PCM cell of claim 1, further including a select device layer, wherein the second electrode is positioned between the PCM layer and the select device layer.

16. The PCM cell of claim 15, further including a third electrode, wherein the select device layer is positioned between the second electrode and the third electrode.

17. A method of manufacturing a phase change memory (PCM) structure, comprising:
   forming a PCM cell stack comprising:
      one or more second electrode layers,
      a PCM layer disposed on the one or more second electrode layers, and
      one or more first electrode layers disposed on the PCM layer,
      wherein each of the one or more second electrode layers and each of the one or more first electrode layers include an upper barrier layer, a lower barrier layer, and a metal ceramic composite material layer disposed between and in direct contact with the upper barrier layer and the lower barrier layer,
      wherein a composition of the upper barrier layer and a composition of the lower barrier layer are selected to provide thermal stability to the metal ceramic composite material layer, wherein said each of the one or more second electrode layers and said each of the one or more first electrode layers includes only layers superimposed on one another, and wherein the metal ceramic composite material layer is made of a material different from a material of upper barrier layer and lower barrier layer; and defining a plurality of individual PCM cells by forming a trench between individual PCM cells;

forming a dielectric material to electrically insulate individual PCM cells from one another;

forming a via within a portion of the formed dielectric material, said via having an orientation that is substantially parallel to the individual PCM cells;

forming a bit line in contact with the plurality of individual PCM cells and the via; and forming a first lamina layer between the one or more first electrode layers and the PCM layer.

18. The method of claim 17, further comprising:
forming a second lamina layer between the one or more second electrode layers and the PCM layer.

19. The method of claim 17, further comprising depositing a second dielectric material between individual PCM cells.

20. The method of claim 17, wherein the one or more second electrode layers are positioned between the PCM layer and a select device layer.

21. The method of claim 20, wherein the select device layer is formed between the one or more second electrode layers and a third electrode layer.

22. The method of claim 21, wherein the third electrode layer is electrically coupled to a wordline.

23. The method of claim 17, wherein the one or more first electrode layers are positioned between the PCM layer and the bitline.

* * * * *